United States Patent
Lan et al.

(12)

(10) Patent No.: US 6,521,986 B2
(45) Date of Patent: Feb. 18, 2003

(54) SLOT APPARATUS FOR PROGRAMMABLE MULTI-CHIP MODULE

(76) Inventors: Hsin-Chang Lan, 13Fl., No. 7, Lane 6, Juangjing Rd., Shinyi Chiu, Taipei (TW), 110; Mao-Hsu Yen, 4Fl., No. 6, Alley 12, Lane 250, Sec.,2, Chenggung Rd., Neihu Chiu, Taipei (TW), 114

( * ) Notice: Subject to any disclaimer, the term of this patent is extended or adjusted under 35 U.S.C. 154(b) by 70 days.

(21) Appl. No.: 09/865,213

(22) Filed: May 24, 2001

(65) Prior Publication Data

US 2002/0175398 A1 Nov. 28, 2002

(51) Int. Cl.$^7$ ............................................... H01L 23/02
(52) U.S. Cl. ....................................... 257/679; 257/678
(58) Field of Search ................................. 257/678, 679; 438/51, 55, 15, 60, 61, 62; 326/37, 38, 39

(56) References Cited

U.S. PATENT DOCUMENTS 5,432,708 A * 7/1995 Mohsen ...................... 364/488
5,537,295 A * 7/1996 Van Den Bout et al. ... 361/767

* cited by examiner

Primary Examiner—Richard Elms
Assistant Examiner—Brad Smith
(74) Attorney, Agent, or Firm—Snell & Wilmer L.L.P.

(57) ABSTRACT

This programmable multi-chip module (PMCM) substrate consists of an array of apparatus slots for bare-die attachment and Field Programmable Interconnect Chips (FPICs) for multi-chip module (MCM) substrate routing. A slot apparatus on a PMCM, which allows the bare-dies flexible attached on the slot apparatus is disclosed. The slot apparatus includes a plurality of first-slot-modules for accommodating and connecting at least one bare-die. Therefore, the PMCM assembled by the inventive slots provides a fast-built, error-detecting, and general-purpose substrate.

20 Claims, 9 Drawing Sheets

SLOT APPARATUS FOR PROGRAMMABLE MULTI-CHIP MODULE

BACKGROUND OF THE INVENTION

1. Field of the Invention

The present invention relates to a slot apparatus, which allows the bare-dies to be attached on the slot apparatuses for a programmable multi-chip module or a high-density multi-layer printed circuit board.

2. Description of the Related Arts

Portable systems design and add-on cards have stringent limits on low-power and small-size constraints. A Multi-Chip Module (MCM) is a device in which several bare-dies are attached to a single substrate and then packaged as a small-size and low-power system. Furthermore, MCM packaging technology used in electronic systems translate the semiconductor speed into system performance, but low-power and high-density MCMs are expensive to fabricate and usually require weeks of engineering effort for system prototyping and product verification. The engineering delay in designing and fabricating such MCMs become unacceptable in today's competitive market. The needs of quick turnaround time, high product yield, and low cost have led to the development of another approach, called Programmable Multi-Chip Module (PMCM).

This PMCM technology provides the designers with a pre-characterized MCM substrate and some programmable interconnections such that they can generate a fast prototyping or a final consumer product in a short time. The advantages of PMCM are that the field programmable technology can reduce product development cycle and NRE (Non-Recurrence Engineering) cost, while MCM technology can achieve low power and small size.

This PMCM substrate consists of an array of slot apparatuses for bare-dies attachment and Field Programmable Interconnect Chips (FPICs) for MCM substrate routing. Each bare-die pad is connected via a metal wire to a pad of the FPIC, and net routing is accomplished by programming the FPICs. Aptix and I-Cube are both well-known FPIC manufacturers.

Figure 1:
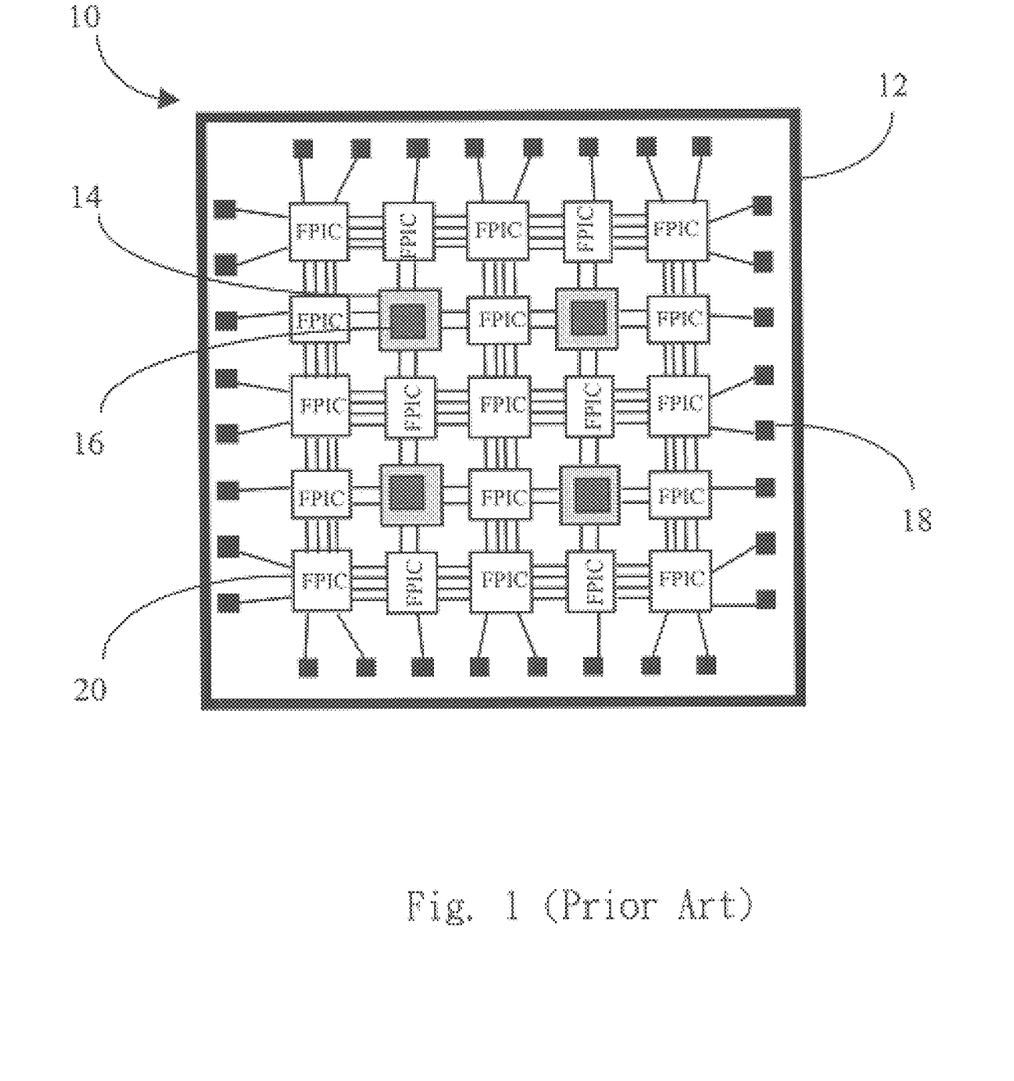
FIG. 1 illustrates a PMCM according to the prior art.

FIG. 1 illustrates a programmable multi-chip module (PMCM) 10 according to the prior art. The PMCM 10 includes a substrate 12, a plurality of slot apparatuses 14 disposed on the substrate 12, and a plurality of bare-dies 16 attached on slot apparatuses 14. A plurality of pads 18 of PMCM 10 is disposed around the near-edge area of the substrate 12. A plurality of FPICs 20 is disposed on the substrate 12 and is located around the corresponding slot apparatuses 14 to interconnect the plurality of pads on the slot apparatuses 14 and the plurality of pads 18 on the PMCM. Each of the bare-die 16 is attached on one slot 14 using the wire bonding technology and is connected to one pad (not shown) on the slot apparatus 14. Each pad of slot apparatuses 14 is connected via a metal wire to one of the FPIC pads 20.

According to the prior art, each slot 14 on the PMCM 10 only accommodates one single bare-die 16. The number of bare-dies 16 disposed on the PMCM 10 is the same as the number of slot apparatuses 14 available. That is, the PMCM 10 of the prior art does not allow a flexible arrangement of the bare-dies 16. Furthermore, once the slot 14 is designed, the number of pads of a bare-die attached on the slot is limited by constraint. It is not feasible to apply the PMCM 10 of the prior art when a plurality of bare-dies 16 with different sizes and with different pad numbers is to be disposed on the PMCM 10.

SUMMARY OF THE INVENTION

To solve the aforementioned problems, the present invention discloses a slot apparatus on a PMCM. The purpose of these flexible slot apparatuses is aimed at attaching bare-dies 16 with different sizes and with different pad numbers on a PMCM 10 in different combinations. The slot apparatus of the present invention includes a plurality of the first-slot-modules to attach to at least one bare-die. Each slot pad is connected via a substrate metal wire to one of the FPIC pads, and the net routing is accomplished by programming the FPICs.

According to the present invention, a PMCM substrate with the slot apparatuses can provide a fast-built and low-cost prototyping system.

DETAILED DESCRIPTION OF THE INVENTION

Figure 2:
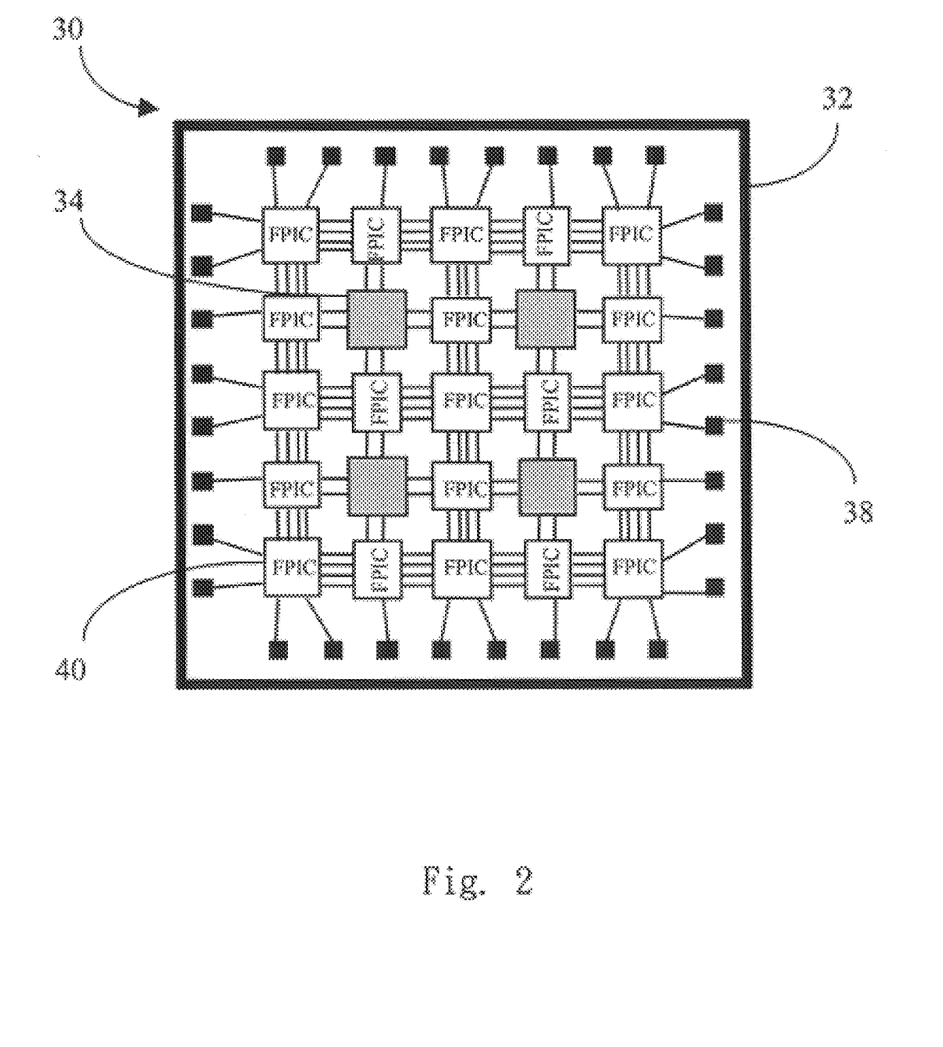
FIG. 2 illustrates a PMCM utilizing the slots of the present invention.

FIG. 2 illustrates the PMCM 30 containing the slot apparatuses 34 of the present invention. The present invention provides slot apparatuses 34 with a plurality of bare-dies 36 attachments on a PMCM 30. The PMCM 30 includes a substrate 32, a plurality of slots 34, a plurality of pads 38 of the PMCM, and a plurality of FPICs 40.

The slots 34 allow bare-dies 36 with different pad numbers to attach on the MCM substrate 32. The pads 38 of PMCM are residing around the near-edge area of the MCM substrate 32. The FPICs 40 are attached on the substrate 32 and are located around the slots 34 for interconnecting the pads of slots 34 and the external pads 38.

Figure 3:
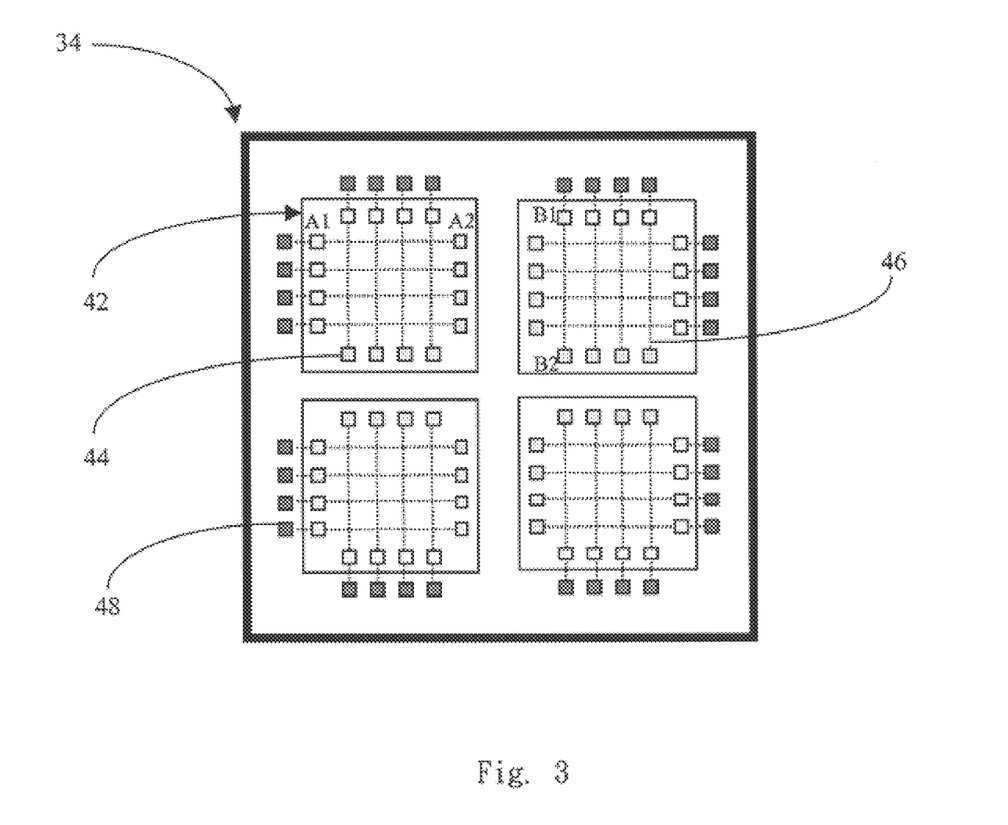
FIG. 3 illustrates a slot apparatus according to the present invention.
Figure 4:
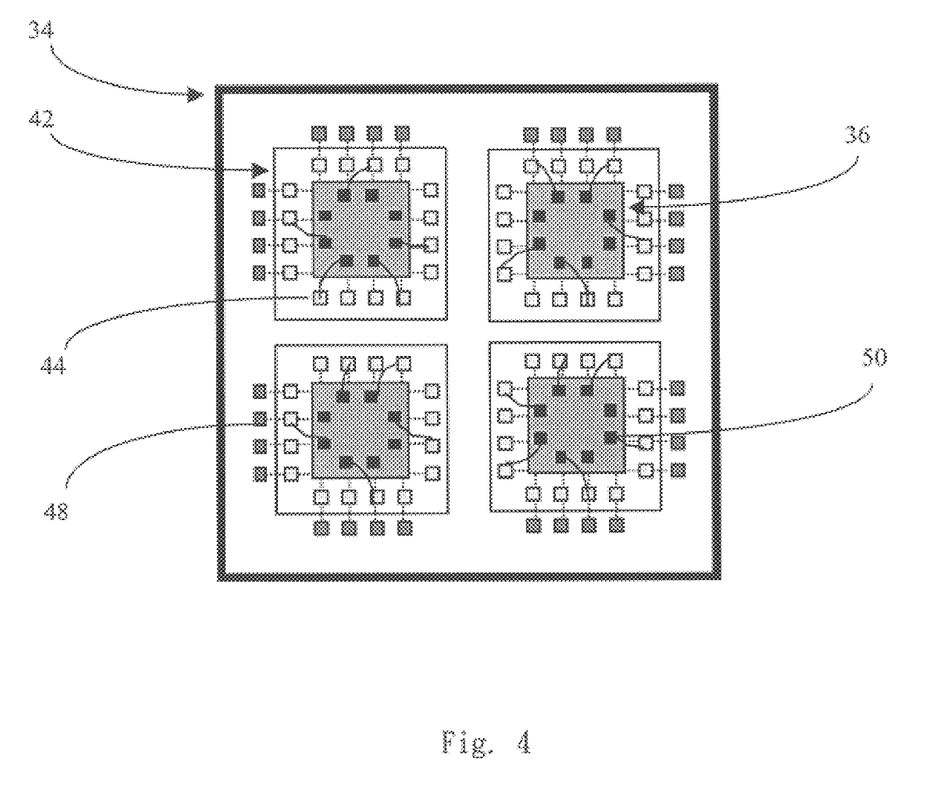
FIG. 4 illustrates the first embodiment of the arrangement of bare-dies attached on the slot apparatus as shown in FIG. 3.

Please refer to FIG. 3 and FIG. 4. FIG. 3 illustrates the slot apparatus 34 according to the present invention, and FIG. 4 illustrates the first embodiment of the arrangement of bare-dies 36 attached on the slot apparatus 34. The slot apparatus 34 of present invention includes four first-slot-modules 42 on the MCM substrate 32, and a bare-die 36 can be attached on the first-slot-modules 42. Each of the first-slot-modules 42 includes a plurality of internal pads 44 for bare-die attachment. In each of the first-slot-modules 42, each pair of pads 44 in the A1–A2 direction (or pads 44 in the B1–B2 direction orthogonal to the A1–A2 direction) is connected together through metal wiring 46. The slot apparatus 34 of the present invention includes a plurality of external pads 48; each external pad 48 is connected to a pair of the internal pads 44 in the A1–A2 direction (or pads 44 in the B1–B2 direction orthogonal to the A1–A2 direction). The external pads 48 of a slot apparatus 34 are connect to the pads of FPICs 20 through metal wiring 46.

Please refer to FIG. 4. Four bare-dies 36 are attached on the slot apparatus 34, and each bare-die 36 includes a plurality of pads 50. The pads 50 of each bare-die 36 are connected to the internal pads 44 of the first-slot-module 42 by using the wire-bonding technology. Each pad 48 of slot apparatus 34 is connected via metal wires to one of the FPIC 20 pads, and the net routing between the pads of slot apparatuses 34 and the pads 38 is accomplished by programming the FPICs 20.

Figure 5:
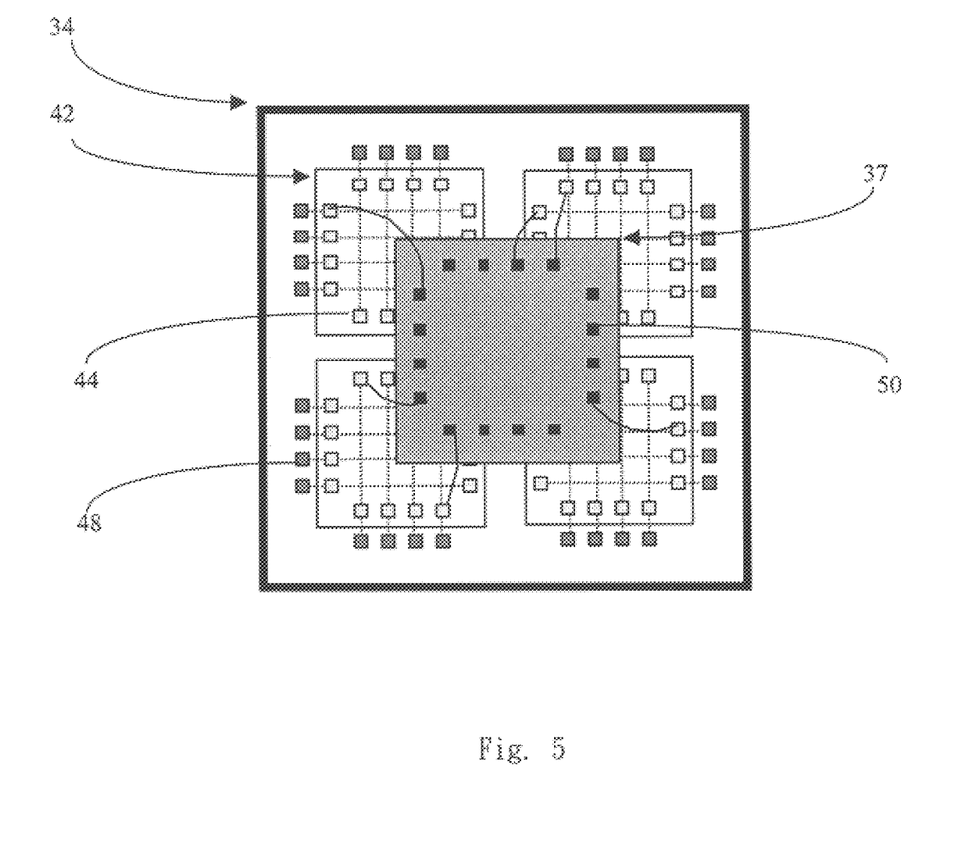
FIG. 5 illustrates the second embodiment of the arrangement of a bare-die attached on the slot apparatus as shown in FIG. 3.

Please refer to FIG. 5. FIG. 5 illustrates the second embodiment of a large bare-die 37 attached on the slot apparatus 34 (as shown in FIG. 3). The bare-die 37 includes a plurality of pads 50; the pads 50 of the bare-die 37 are connected to the internal pads 44 of the first-slot-module 42 by using the wire-bonding technology. According to FIG. 5, the large bare-die 37 occupies all the four first-slot-modules 42. Each pad 48 of slot apparatus 34 is connected via a metal wire to one of the FPIC 20 pads, and the net routing between the external pads of slot apparatus 34 and the pads 38 is accomplished by programming the FPICs 20.

Because the slot apparatus 34 of the present invention includes four first-slot-modules 42, the slot apparatus 34 may accommodate at least one bare-die 36, 37. On the slot apparatus 34, we can have four small bare-dies to attach on the four first-slot-modules 42, as shown in FIG. 4, or a large bare-die 37 occupying all the four first-slot-modules 42, as shown in FIG. 5. In addition, each of the first-slot-modules 42 includes a plurality of internal pads 44. Therefore the slot apparatus 34 of the present invention may accommodate a plurality of bare-dies 36, 37 of different sizes and with different pad numbers. Similarly, the slot apparatus 34 of the present invention may also be used to connect a plurality of chips (not shown) to the PMCM 30, where the chips refer to the packaged electronic components with a plurality of pins. Meanwhile, the slot apparatus 34 of the present invention may be applied to a high-density multi-layer programmable printed circuit board (not shown) to connect the bare-dies 36, 37 or the chips connected to the printed circuit board.

Figure 6:
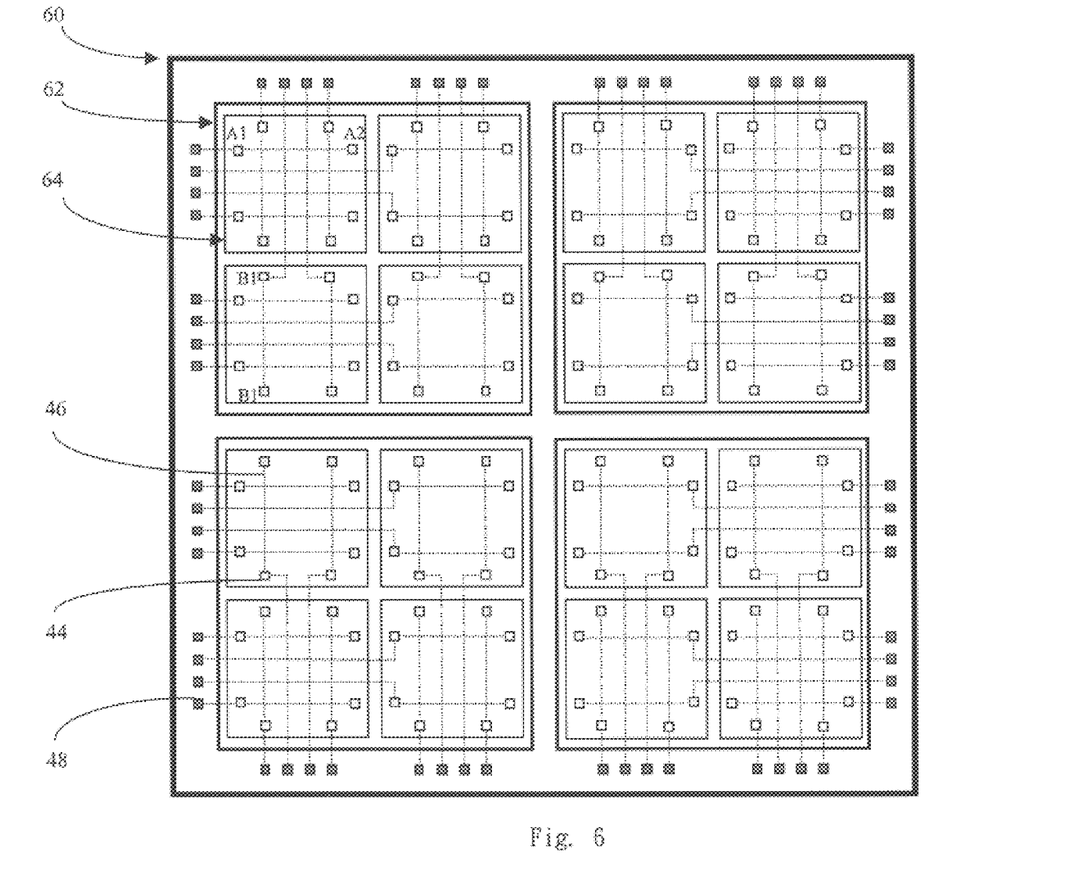
FIG. 6 illustrates another embodiment of the slot apparatus according to the present invention.
Figure 7:
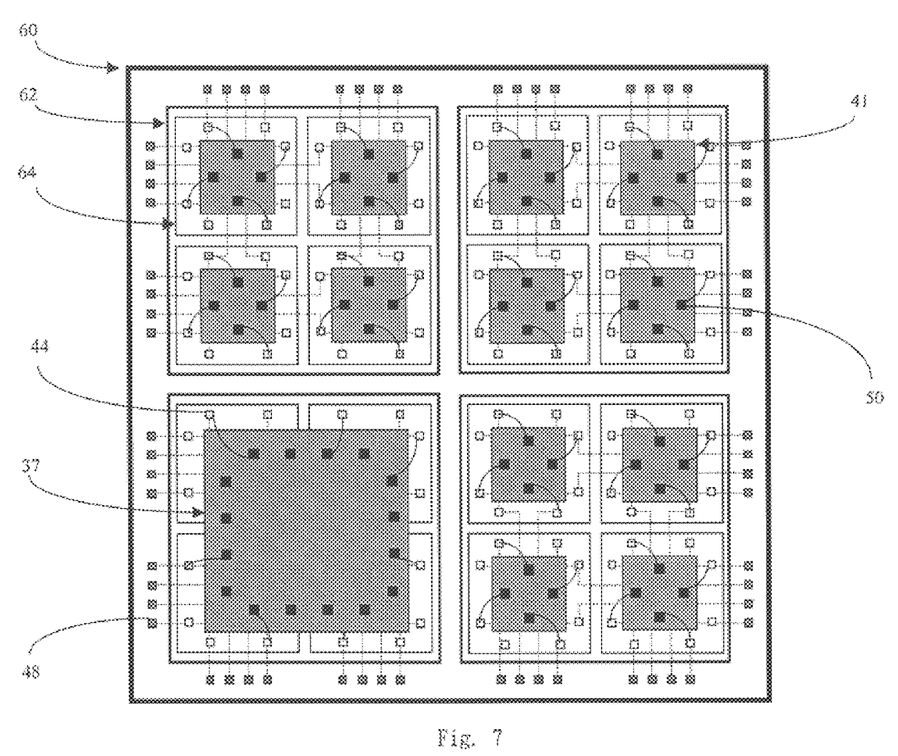
FIG. 7 illustrates the first embodiment of the arrangement of bare-dies attached on the slot apparatus as shown in FIG. 6.

Please refer to FIG. 6. FIG. 6 illustrates another embodiment of the slot apparatus 60 according to the present invention. The slot apparatus 60 of the embodiment includes four first-slot-modules 62, each of the first-slot-modules 62 includes four second-slot-modules 64, and each of the second-slot-modules 64 is residing on the MCM substrate 32 to accommodate at least one bare-die 41 (as shown in FIG. 7). Each of the second-slot-modules 64 includes a plurality of internal pads 44, and each of the internal pads 44 can be connected to the pads of bare-dies 41.

In each of the second-slot-modules 64, each pair of pads 44 in the A1–A2 direction (or pads 44 in the B1–B2 direction orthogonal to the A1–A2 direction) is connected together through metal wiring 46. The slot apparatus 60 of the present invention includes a plurality of external pads 48, each external pad 48 is connected to a pair of the internal pads 44 in the A1–A2 direction (or pads in the B1–B2 direction orthogonal to the A1–A2 direction). The external pads 48 of a slot apparatus 60 are connect to the pads of FPICs 20 through metal wiring 46.

Please refer to FIG. 7. FIG. 7 illustrates the first embodiment indicating the bare-dies 41, 37 attached on the slot apparatus 60 as shown in FIG. 6. The slot apparatus 60 accommodates twelve bare-dies 41 and a single bare-die 37, and each bare-die 41, 37 includes a plurality of pads 50. The pads 50 of each bare-die 41, 37 are connected to the internal pads 44 of the second-slot-modules 64 by using the wire-bonding technology. Each bare-die 41 is attached on a second-slot-module 64, while the large bare-die 37 occupying and attaching on all the four second-slot-modules 64. Each pad of slot apparatus 60 is connected via a metal wire to one of the FPIC 20 pads, and the net routing between the external pads 48 of slot apparatus 60 and the pads 38 is accomplished by programming the FPICs 20.

Figure 8:
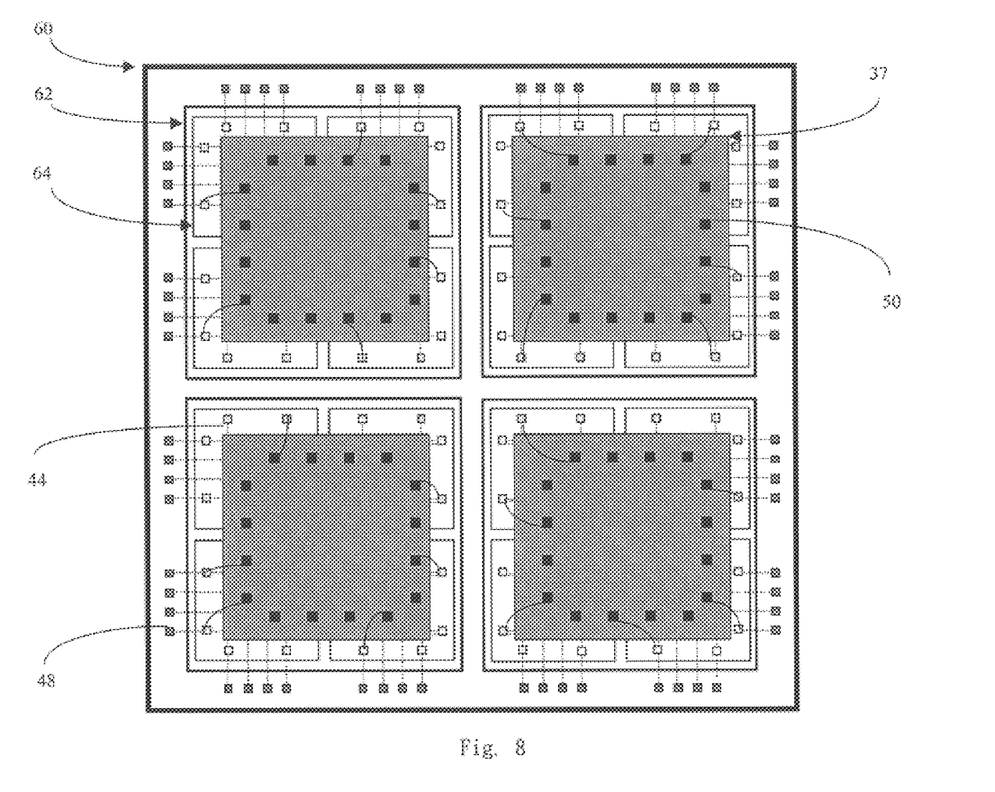
FIG. 8 illustrates the second embodiment of the arrangement of bare-dies attached on the slot apparatus as shown in FIG. 6.

Please refer to FIG. 8. FIG. 8 illustrates the second embodiment of bare-dies 37 attached on the slot apparatus 60 (as shown in FIG. 6). The slot apparatus 60 accommodates four bare-dies 37, and each bare-die 37 includes a plurality of pads 50. The pads 50 of each bare-die 37 are connected to the internal pads 44 of the second-slot-modules 64 by using the wire-bonding technology, and each bare-die 37 is attached on four second-slot-modules 64. Further, programming the FPIC 40 completes the net routing between the bare-dies 37 and the pads 38.

Figure 9:
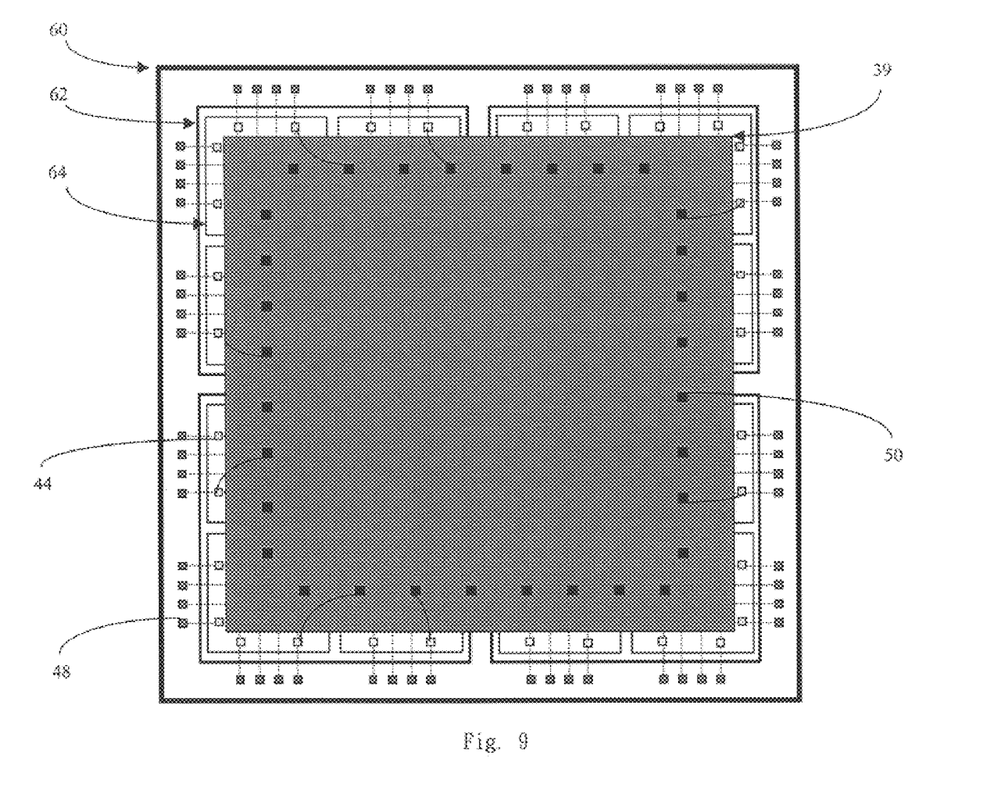
FIG. 9 illustrates the third embodiment of the arrangement of bare-dies attached on the slot apparatus as shown in FIG. 6.

Please refer to FIG. 9. FIG. 9 illustrates the third embodiment a large bare-die 39 attached on the slot apparatus 60 as shown in FIG. 6. The bare-die 39 includes a plurality of pads 50. The pads 50 of the bare-die 39 are connected to the internal pads 44 of the second-slot-modules 64 by using the wire-bonding technology, and the bare-die 39 is attached on sixteen second-slot-modules 64.

The slot apparatus 60 according to the embodiment of the present invention includes four first-slot-modules 62 and sixteen second-slot-modules 64, and therefore the slot apparatus 60 of the present invention may accommodate at least one bare-die 37, 39, 41. The slot apparatus 60 shown in FIG. 7 accommodates twelve bare-dies 41 and one single bare-die 37, the slot apparatus 60 shown in FIG. 8 accommodates four bare-dies 37, and the slot apparatus 60 shown in FIG. 9 accommodates only one single bare-die 39. Furthermore, each of the second-slot-modules 64 includes a plurality of internal pads 44 so that the slot apparatus 60 of the present invention accommodates the bare-dies 37, 39, 41 with different sizes and with different pads numbers. In addition, the slot apparatus 60 of the present invention may be used to connect a plurality of chips (not shown) to the PMCM 30. Meanwhile, the slot apparatus 60 of the present invention may be applied to a high-density multi-layer printed circuit board (not shown) to accommodate the bare-dies 36, 37, 39, 41.

The multi-chip module or the printed circuit board assembled by the slot apparatuses 34, 60 of the present invention has the following advantages when compared with the PMCM 10 of the prior art:

1. The slot apparatus of the present invention may be applied to a multi-chip module or a printed circuit board to function as a general-purpose substrate. The bare-dies or chips with different sizes and with different pad numbers may be attached on the general-purpose substrate in a fast and convenient way. Therefore those expensive substrates are not necessary any more. The present invention saves much time and money and lowers the cost.

2. The slot apparatus of the present invention may be applied to a PMCM or a programmable printed circuit board to function as a programmable general-purpose substrate. The slots and the FPICs on the PMCM are made and well tested in advance. The FPICs are attached on the general-purpose substrate and are provided to the user. Therefore, the PMCM assembled by the slot apparatuses of the present invention is easily error detecting and is easily to be modified. The present invention then reduces the probability of failure, increases the yield of the products, and accelerates the production process.

It will be understood that certain features and sub-combinations are of utility and may be employed without reference to other features and sub-combinations as they are outlined within the claims. For example, the slot apparatus of the present invention includes a plurality of first-slot-modules, and each of the first-slot-modules may include a plurality of second-slot-modules. Each of the second-slot-modules may further include a plurality of smaller slot-modules. While the preferred embodiment and application of the invention has been described, it is apparent to those skilled in the art that the objects and features of the present invention are only limited as set forth in claims attached hereto.

What is claimed is:

1. A slot apparatus allowing flexible arrangement of P bare-dies, said P bare-dies being connected to a programmable substrate by said slot apparatus, said programmable substrate comprising Q field programmable interconnect chips (FPICs), said slot apparatus being connected to said FPICs, and said slot apparatus comprising L first-slot-modules for accommodating and connecting at least one of said P bare-dies, wherein P, Q, and L are integers greater than 1.

2. The slot apparatus of claim 1, wherein each of said L first-slot-modules comprises M internal pads for said bare-dies attachment, and M is an integer greater than 1.

3. The slot apparatus of claim 2, wherein each pair of said M internal pads in one direction are connected by means of a metal wire, and each pair of said M internal pads in the other direction are connected by means of a metal wire.

4. The slot apparatus of claim 3, wherein said slot apparatus comprises N external pads to connect each pair of said M internal pads in one direction and to connect each pair of said M internal pads in the other direction, said N external pads are adopted as external connection points of said slot apparatus, and N is an integer greater than 1.

5. The slot apparatus of claim 4, wherein said N external pads of said slot apparatuses on said programmable substrate are connected to each other by programming said FPICs.

6. The slot apparatus of claim 1, wherein each of said bare-die has different number of pads on said programmable substrate.

7. The slot apparatus of claim 1, wherein each of said bare-die is attached on at least one of said first-slot-module by using wire-bonding technology.

8. The slot apparatus of claim 1, wherein said slot apparatus connects P chips to said programmable substrate.

9. The slot apparatus of claim 1, wherein said programmable substrate is a programmable multi-chip module (PMCM) substrate.

10. The slot apparatus of claim 1, wherein said programmable substrate is a programmable printed circuit board.

11. A slot apparatus allowing flexible arrangement of P bare-dies, said P bare-dies being connected to a programmable substrate by said slot apparatus, said programmable substrate comprising Q field programmable interconnect chips (FPICs), said slot apparatus being connected to at least one of said Q FPICs on said programmable substrate, said slot apparatus comprising L first-slot-modules, and each of said L first-slot-modules comprising R second-slot-modules for accommodating and connecting at least one of said P bare-dies, wherein P, Q, L, and R are integers greater than 1.

12. The slot apparatus of claim 11, wherein each of said second-slot-module comprises M internal pads connecting to said bare-dies, and M is an integer greater than 1.

13. The slot apparatus of claim 12, wherein each pair of said M internal pads in one direction are connected by means of a metal wire, and each pair of said M internal pads in the other direction are connected by means of a metal wire.

14. The slot apparatus of claim 13, wherein said slot apparatus comprises N external pads to connect each pair of said M internal pads in one direction and to connect each pair of said M internal pads in the otherdirection, said N external pads are adopted as external connection points of said slot apparatus, and N is an integer greater than 1.

15. The slot apparatus of claim 14, wherein said N external pads of said slot apparatuses on said programmable substrate are connected to each other by programming said FPICs.

16. The slot apparatus of claim 11, wherein each of said bare-die has different number of pads on said programmable substrate.

17. The slot apparatus of claim 11, wherein each of said bare-die is attached on at least one of said second-slot-module by using wire-bonding technology.

18. The slot apparatus of claim 11, wherein said slot apparatus connects P chips to said programmable substrate.

19. The slot apparatus of claim 11, wherein said programmable substrate is a programmable multi-chip module (PMCM) substrate.

20. The slot apparatus of claim 11, wherein said programmable substrate is a programmable printed circuit board.

* * * * *